United States Patent
Kengeri et al.

(10) Patent No.: US 7,298,659 B1
(45) Date of Patent: Nov. 20, 2007

(54) METHOD AND SYSTEM FOR ACCELERATED DETECTION OF WEAK BITS IN AN SRAM MEMORY DEVICE

(75) Inventors: Subramani Kengeri, San Jose, CA (US); Deepak Sabharwal, New Delhi (IN); Prakash Bhatia, Fremont, CA (US); Sanjiv Kainth, New Delhi (IN)

(73) Assignee: Virage Logic Corporation, Fremont, CA (US)

( * ) Notice: Subject to any disclaimer, the term of this patent is extended or adjusted under 35 U.S.C. 154(b) by 155 days.

(21) Appl. No.: 11/147,791

(22) Filed: Jun. 7, 2005

Related U.S. Application Data

(60) Provisional application No. 60/577,897, filed on Jun. 7, 2004.

(51) Int. Cl.
*G11C 29/00* (2006.01)
(52) U.S. Cl. .................................. 365/201; 365/154
(58) Field of Classification Search ............... 365/201, 365/154, 203
See application file for complete search history.

(56) References Cited

U.S. PATENT DOCUMENTS

| | | | |
|---|---|---|---|
| 5,255,230 A | 10/1993 | Chan et al. | |
| 5,717,645 A | 2/1998 | Kengeri et al. | |
| 5,808,959 A | 9/1998 | Kengeri et al. | |
| 6,259,634 B1 | 7/2001 | Kengeri et al. | |
| 6,434,040 B1 | 8/2002 | Kim et al. | |
| 6,452,834 B1 | 9/2002 | Kengeri | |
| 6,501,692 B1 * | 12/2002 | Melanson et al. ......... 365/201 |
| 6,643,804 B1 | 11/2003 | Aipperspach et al. | |
| 6,667,917 B1 * | 12/2003 | Templeton et al. ......... 365/201 |
| 6,711,076 B2 * | 3/2004 | Braceras ..................... 365/201 |
| 6,788,574 B1 | 9/2004 | Han et al. | |
| 6,992,938 B1 | 1/2006 | Shubat et al. | |
| 7,069,522 B1 | 6/2006 | Sluss et al. | |
| 7,130,213 B1 | 10/2006 | Raszka | |
| 7,149,924 B1 | 12/2006 | Zorian et al. | |
| 2006/0187724 A1 * | 8/2006 | Pineda De Gyvez et al. .... 365/201 |

OTHER PUBLICATIONS

Josh Yang et al., "Open Defects Detection within 6T SRAM Cells using a No Write Recovery Test Mode", IEEE Computer Society, Proceedings of the 7th International Conference on VLSI Design (VLSID'04), 2004 IEEE, pp. 6 total.

Doe-Hyun Yoon et al., "Dynamic Power Supply Current Testing for Open Defects in CMOS SRAMs", ETRI Journal, vol. 23, No. 2, Jun. 2001, pp. 77-84.

* cited by examiner

*Primary Examiner*—Anh Phung
(74) *Attorney, Agent, or Firm*—Blakely Sokoloff Taylor & Zafman LLP

(57) ABSTRACT

A method and system for testing the individual memory cells of a volatile memory cell array (e.g., SRAM) for data retention faults are described. In one embodiment of the invention, adjacent memory cells connected by a pair of common bit-lines are written with opposite, or complementary, data, for example, logical "0" and logical "1". Next, the two memory cells are subjected to a stress condition by pre-charging the common bit-lines connecting the two adjacent memory cells, and then simultaneously asserting the word-line of each memory cell. Finally, the data in each cell is read and compared with the data written to the cell prior to generating the stress condition.

45 Claims, 6 Drawing Sheets

METHOD AND SYSTEM FOR ACCELERATED DETECTION OF WEAK BITS IN AN SRAM MEMORY DEVICE

RELATED APPLICATIONS

The present application is related to and claims the benefit of the filing date of U.S. Provisional Patent Application with Ser. No. 60/577,897, filed on Jun. 7, 2004, which is hereby incorporated herein by reference.

TECHNICAL FIELD

The present invention relates generally to the testing of solid-state memory devices. More particularly, the present invention relates to an improved method and system for testing the memory cells of volatile memory devices, such as static random access memories (SRAMs), for data retention faults.

BACKGROUND

As fabrication methods have improved and smaller geometry technologies, such as 90-nanometer design, have been developed, the area of silicon required to produce a memory device having a given data storage capacity has continued to decrease. Generally, these technological advances have led to a greater number of memory devices per silicon wafer, and consequently, a lower cost per memory device. Meanwhile, the overall storage capacity of memory devices has been continuously increasing. Unfortunately, this trend has resulted in significantly increasing the complexity involved in the testing of some memory devices. In particular, it has become increasingly challenging to rapidly and cost-effectively identify manufacturing defects in volatile memory devices, such as CMOS SRAM memory devices.

An SRAM memory cell is a volatile memory cell that uses a flip-flop circuit to store data. In contrast, a dynamic random access memory (DRAM) cell utilizes a single transistor in conjunction with a capacitor that requires continuous refreshing to retain its data. Defects in both types of volatile memory lead to potential stability or data retention problems.

FIG. 1 illustrates a schematic diagram of an example prior art six-transistor memory cell 10 commonly used in CMOS SRAM memory devices. As illustrated in FIG. 1, the SRAM memory cell 10 includes two N-channel field effect transistors (FETs) (e.g., T1 and T2) interconnected with two cross-coupled P-channel transistors (e.g., T3 and T4). A second pair of N-channel transistors (e.g., T5 and T6) have their gate terminals connected to the word-line and serve as "pass" gates to close the paths between the bit-lines BIT and #BIT# (where #BIT# indicates that an opposite, or complementary, logic state is asserted on the bit-line when setting the memory cell 10 to a particular logic state) and the memory transistors T1 and T2 of the cell.

In the SRAM memory cell 10 illustrated in FIG. 1, if the pull-up P-devices (e.g., transistors T3 and T4) are too weak due to a fabrication defect, the memory cell 10 may be able to write and store the input data, but may nonetheless fail to retain the logic value over time. The resulting fault in a defective cell is generally referred to as a data retention fault. In a defective memory cell, the retention time generally depends on the nature of the defect including the level of current leakage as well as the node capacitance. For example, if current leakage is high and/or the node capacitance is low, the memory cell may undesirably "flip" its logical state after a period of time.

Traditionally, data retention faults have been tested by writing a logical "0" or logical "1" to a memory cell, waiting an appropriate amount of time, and then reading back the value to verify that it is the same value that was originally written. However, given the number of memory cells involved and the amount of wait time required to detect a data retention fault, such testing is extremely time consuming and significantly adds to manufacturing costs.

To further complicate matters, it is increasingly common for memory devices to be embedded in computer chips, for example, application specific integrated circuits (ASICs) and/or systems-on-a-chip (SoCs). When a memory device is embedded, it may become more difficult to access the bit-lines and word-lines of the memory device, thereby making it even more difficult to test the memory device.

SUMMARY OF THE DESCRIPTION

A method and system for identifying data retention faults in a volatile memory cell are described. According to one embodiment of the invention, opposite data (e.g., a logical "0" and "1") are written to two adjacent volatile memory cells connected by a pair of common bit-lines. Next, a stress condition is generated by pre-charging the pair of common bit-lines, and then simultaneously asserting the word-line for each of the two adjacent memory cells for a predetermined period of time. Finally, the data in the adjacent memory cells is read and compared with the data originally written to the two adjacent memory cells to determine whether a data retention fault has occurred.

BRIEF DESCRIPTION OF THE DRAWINGS

The present invention is illustrated by way of example, and not by way of limitation, in the figures of the accompanying drawings, in which like references indicate similar elements, and in which.

DETAILED DESCRIPTION

Figure 1:
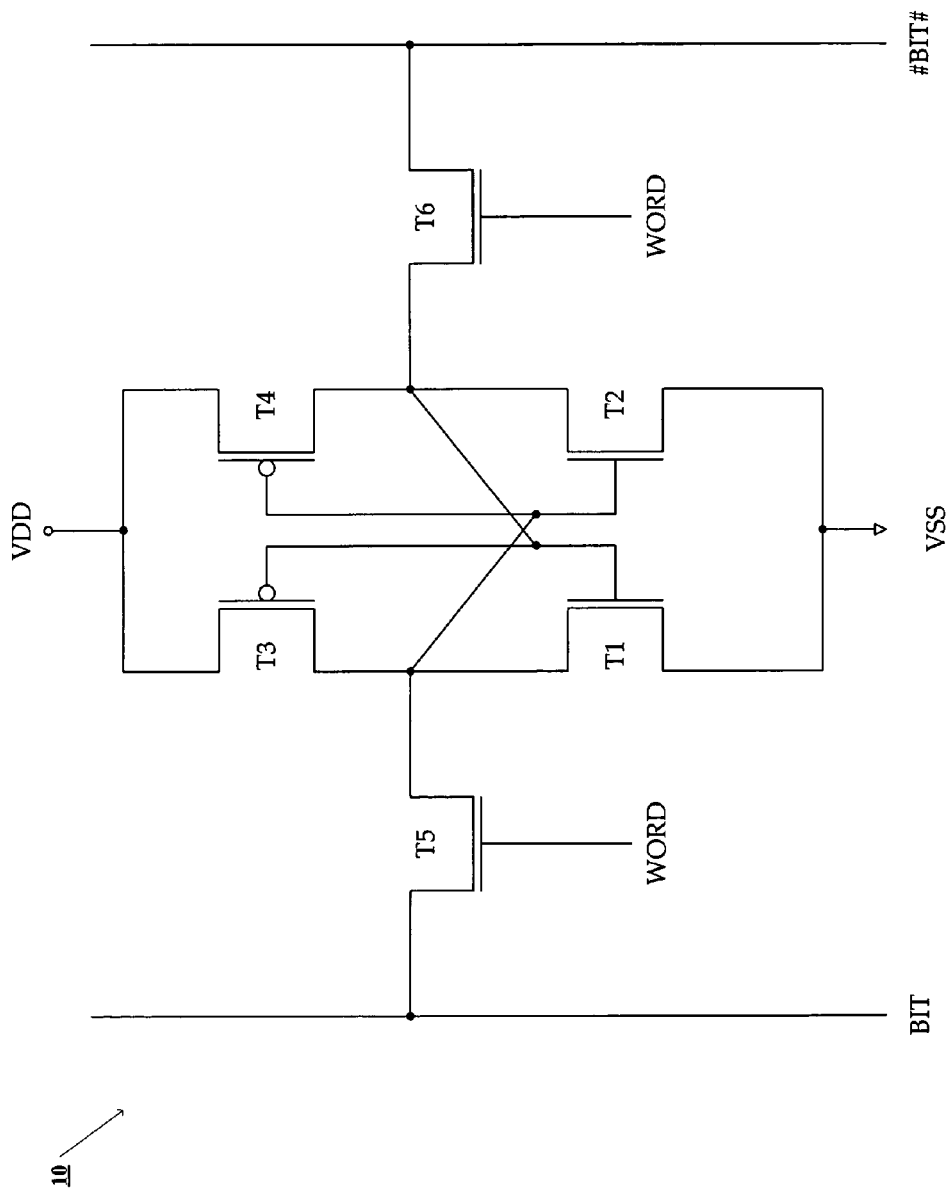
FIG. 1 illustrates a schematic diagram of an example prior art six-transistor memory cell commonly used in CMOS SRAM memory devices.

In general, a method and system for detecting weak bits in a volatile memory device, such as a static random access memory (SRAM), are described. In the following description, for purposes of explanation, numerous specific details are set forth in order to provide a thorough understanding of the present invention. It will be evident, however, to one skilled in the art that the present invention may be practiced without these specific details.

The stability of the individual memory cells of a volatile memory cell array is tested. It will be appreciated that this technology may be implemented in a variety of ways. In particular, memory testing logic may be implemented in hardware or software and may be utilized to test stand-alone or embedded memory devices. For example, in one embodiment of the invention, memory testing logic may be implemented in hardware as a built-in self-test (BIST) engine to test an embedded memory array on a system-on-a-chip. Although many of the examples described herein pertain to embedded memory devices, in alternative embodiments, memory testing logic may be implemented in an external testing circuit that connects to, and performs a memory test on, stand-alone memory devices. Similarly, an embodiment of the invention may be implemented as an external testing circuit that is utilized to perform testing operations on an embedded memory device, stand alone memory, or similar memory. Moreover, the memory devices may be tested during, or at any time after, the manufacturing process. In particular, the memory device may be tested by a BIST in the field, after the memory has been put into operation.

In one embodiment of the present invention, the memory device is tested at a clock frequency substantially equivalent to the maximum operating frequency of the memory device, thereby accelerating the testing of large SRAM memory cell arrays. In contrast, in a traditional data retention fault test, a particular memory cell is placed in a known state (e.g., by writing a logical "1" or "0" to that memory cell), and then after waiting a length of time sufficient for a data retention fault to occur, the state of the memory cell is verified (e.g., by reading the logical state) to determine whether the memory cell has retained its state. However, testing every single memory cell in a large memory array significantly adds to the manufacturing cost of an individual memory device because of the wait time involved. One advantage of the present invention is the time to test an entire array of memory cells is significantly reduced.

According to an embodiment of the present invention, a stress condition is placed on each memory cell being tested, thereby eliminating the need for a long wait time. Neighboring memory cells may be placed in opposite logical states. For example, a first memory cell may be written with a logical "1", while an adjacent memory cell, connected to the first memory cell via a pair of common bit-lines (e.g., BIT and #BIT#), may be written with a logical "0". Next, a stress condition may be placed on the neighboring memory cells by pre-charging the common bit-lines connecting the neighboring memory cells, and then simultaneously asserting the word-lines of the neighboring memory cells for a predetermined length of time (e.g., one clock cycle). If one of the memory cells has a defect (e.g., an open or short circuit), the stress condition will cause the defective cell to be "overwritten" resulting in an undesirable state change.

Figure 2:
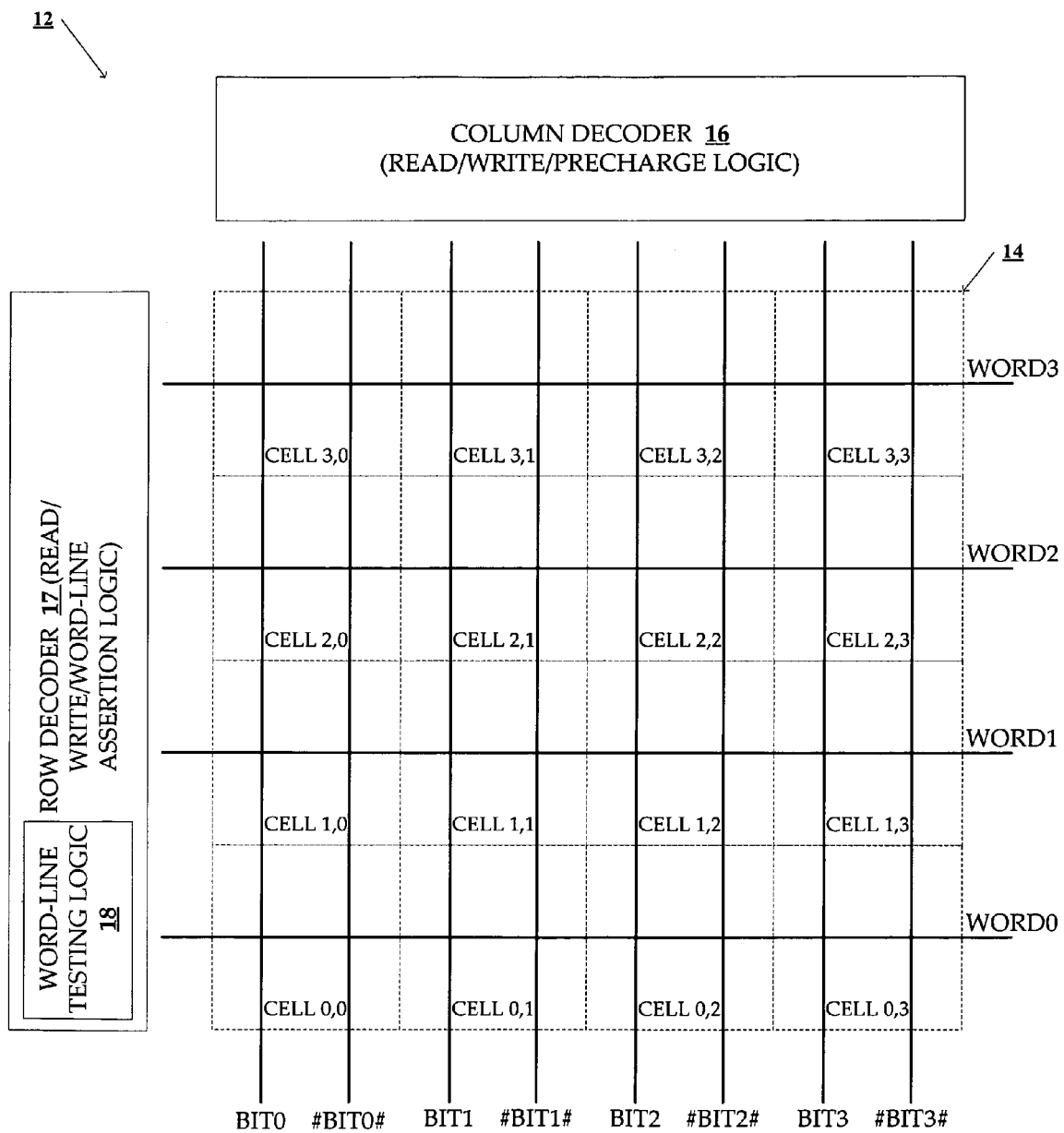
FIG. 2 illustrates a block diagram of an embodiment of a memory device including an array of memory cells, such as the example six-transistor CMOS SRAM memory cell illustrated in FIG. 1.

FIG. 2 illustrates a block diagram of an embodiment of a memory device including an array of memory cells, such as the example six-transistor CMOS SRAM memory cell illustrated in FIG. 1. The memory device 12 includes an array of memory cells 14. The individual transistors making up each memory cell have not been shown, but instead, merely the bit-lines and the word-lines interconnecting the individual memory cells have been illustrated. Accordingly, it can be seen from FIG. 2 that each memory cell is associated with a pair of bit-lines (e.g., BIT and #BIT#), as well as a single word-line. For example, the memory cell with coordinates (0,0) is connected to word-line WORD0 and bit-lines BIT0 and #BIT0#. Similarly, the memory cell with coordinates (2,3) is connected to word-line WORD2 and bit-lines BIT3 and #BIT3#.

In addition, the memory cell array illustrated in FIG. 2 includes column decoder logic 16 and row decoder logic 17. As with a traditional memory device, the column decoder logic 16 may decode input signals to select (e.g., assert or de-assert) a particular bit-line when performing a read or write operation. Similarly, the row decoder logic 17 may respond to input signals by selecting a particular word-line during a read or write operation. However, in an embodiment of the present invention, the row decoder logic 17 includes word-line testing logic 18 for selecting, or asserting, multiple (e.g., neighboring) word-lines during a clock cycle of the memory device, or for a portion of a clock cycle, during a memory cell testing operation. Accordingly, the row decoder logic 17 includes word-line testing logic 18 above and beyond the read/write logic found in a traditional row decoder.

Figure 3:
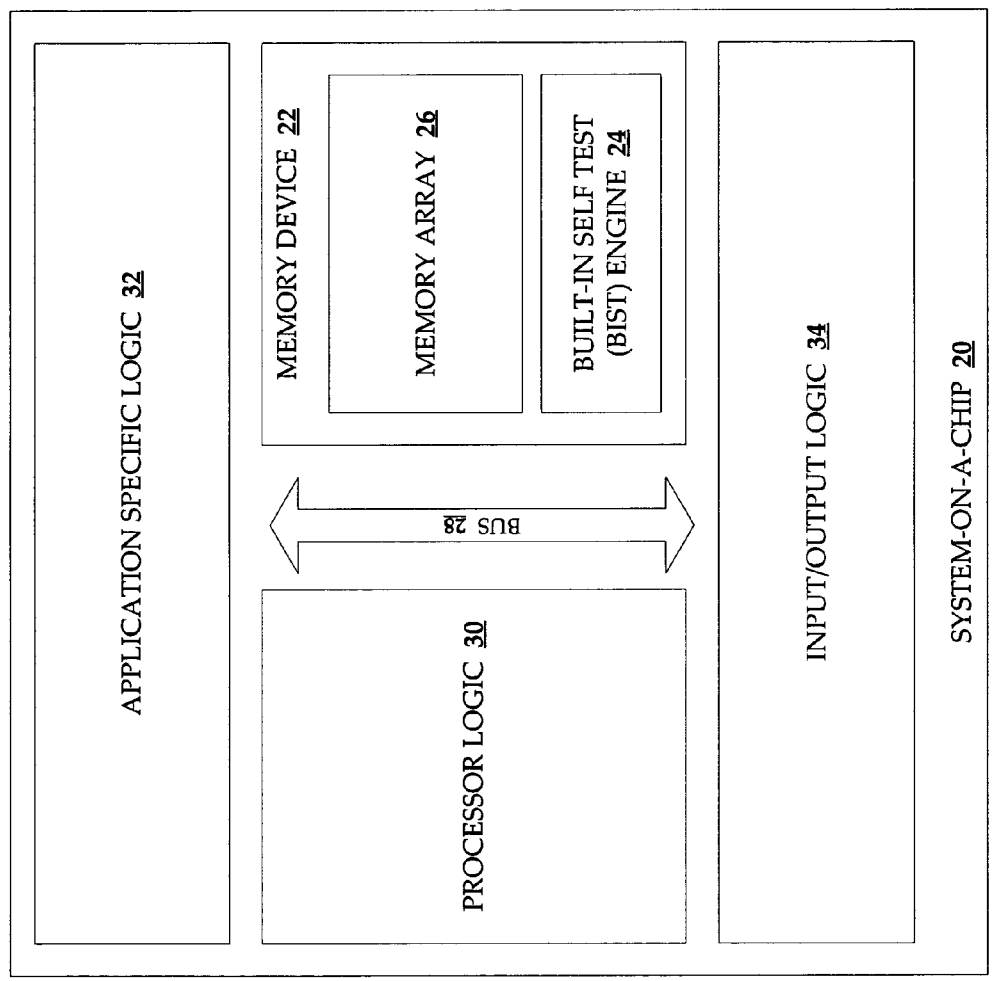
FIG. 3 illustrates a logic diagram of a portion of an embodiment of a System-on-a-Chip (SoC) including a memory device with a built-in self-test (BIST) engine with memory testing logic for testing a memory array.

FIG. 3 illustrates a logic diagram of a portion of an embodiment of a System-on-a-Chip (SoC) 20 including a memory device 22 with a built-in self-test (BIST) engine 24 with memory testing logic for testing a memory array 26. In addition, the SoC 20 includes a bus 28 (e.g., data bus, and/or address bus) that interconnects the memory device 22 with processor logic 30, application specific logic 32, and input/output logic 34. In a typical SoC, a non-volatile memory device (not shown) stores boot-up instructions that are executed by the processor logic 30 when the system is powered on. Depending on the particular system and application, the processor logic 30 of the SoC may execute software programs stored as a sequence of instructions in various memory devices, such as the memory device with reference number 22. In addition, the application specific logic 32 may process data while the input/output logic 34 may send and receive data to various other components (not shown).

In one embodiment of the invention, the BIST engine 24 of the memory device 22 may be designed to perform a series of operations for testing the individual memory cells of the memory array 26 for data retention faults. Accordingly, a memory test may be performed during boot-up, prior to powering down, or at a user-selected time. The SoC 20 may have one or more external data pins on which data related to the memory test is communicated to an external component.

Figure 4:
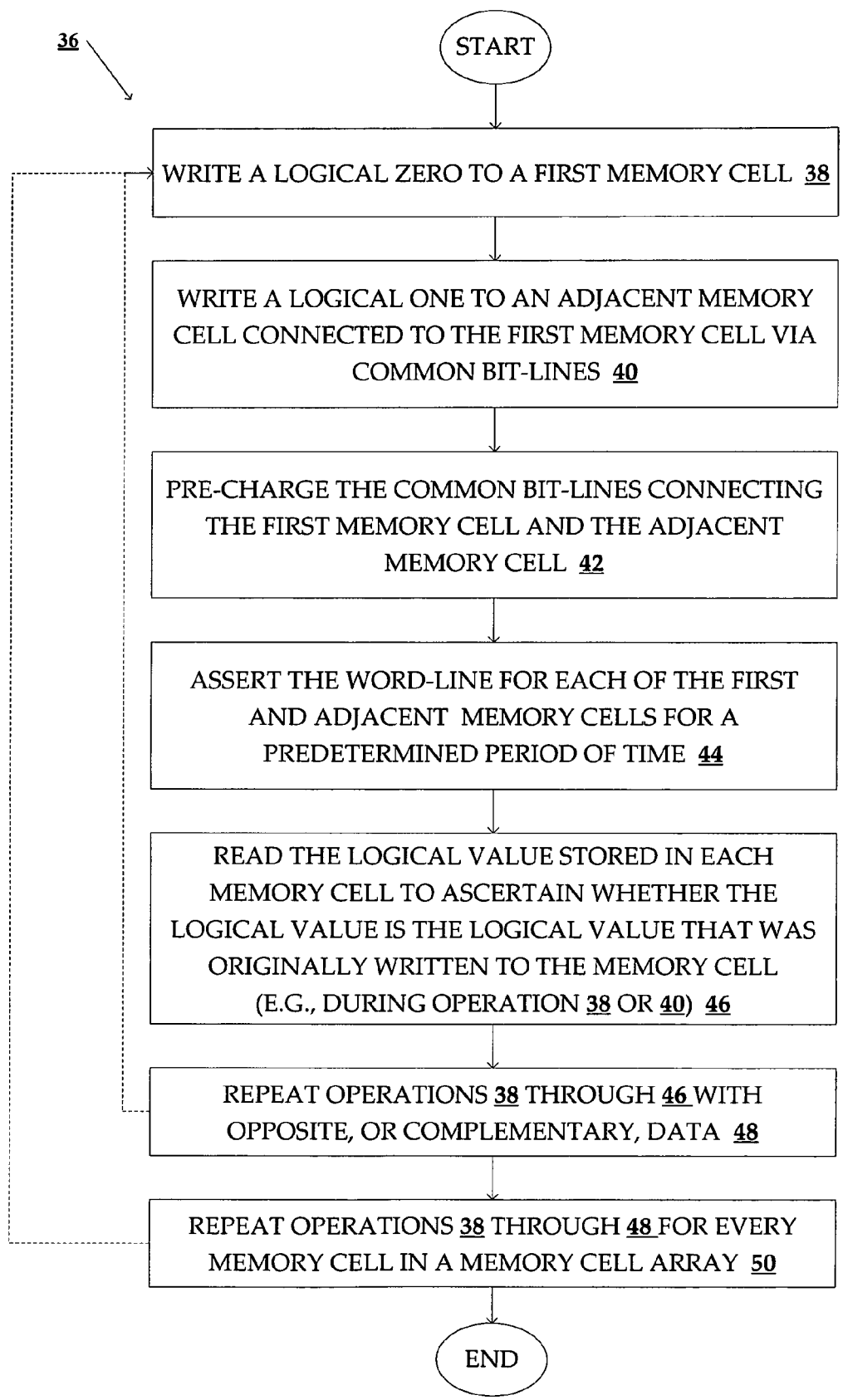
FIG. 4 illustrates a flow chart of a method, consistent with an embodiment of the invention, for testing individual memory cells of a memory array for data retention faults.

FIG. 4 illustrates the operations of a method 36, consistent with one embodiment of the invention, for testing individual memory cells of a memory array for data retention faults. According to one embodiment of the invention, opposite data is written to two adjacent memory cells (e.g., memory cells connected by a pair of common bit-lines) in an SRAM memory cell array. For example, at operation 38, a logical "0" may be written to a first memory cell. Then, at operation 40, a logical "1" may be written to a second memory cell connected to the first memory cell via the common bit-lines.

Next, at operation 42, a stress condition may be generated by first pre-charging the common bit-lines connecting the first and second memory cells, and then, at operation 44, simultaneously asserting the word-line for each of the first and second memory cells for a predetermined period of time. It will be appreciated that pre-charging the common bit-lines may involve applying a voltage source with a pre-charge driver for one or more clock cycles. Accordingly, the pre-charge driver may be turned off, or de-asserted, prior to asserting the word-lines of the neighboring memory cells. Similarly, in one embodiment of the invention, the word-lines of the neighboring memory cells may be asserted for one or more clock cycles of the memory device, or a portion of a clock cycle. For example, in one embodiment of the invention, a first word-line is asserted for an entire clock cycle, while a second word-line is asserted for only a portion of clock cycle.

If the memory cells are free of manufacturing defects, it is expected that the bit-lines (e.g., BIT0 and #BIT0#) will settle to a voltage level that is approximately one half of the power source (e.g., VDD/2). However, if a manufacturing defect exists, one memory cell may "overpower" the weaker memory cell (e.g., the memory cell with the defect) and cause the defective memory cell to flip logical states.

Finally, at operation 46, a read operation is performed to read the logical value of each of the neighboring memory cells to ascertain whether the logical value is the expected logical value. That is, the logical value read after generating the stress condition is compared with the logical value written to the memory cell prior to generating the stress condition. If either memory cell is found to be storing an unexpected logical value (e.g., a logical value other than that which was originally written to the memory cell), a data retention fault has occurred.

Next, at operation 48, memory cell testing operations are repeated using opposite, or complementary, data. For example, a memory cell originally written with a logical "1" (at operation 38) is written with a logical "0", and a memory cell originally written with a logical "0" (at operation 40) is written with a logical "1". Similarly, at operation 50, the entire memory cell test is repeated for each memory cell in the array of memory cells.

Figure 5A:
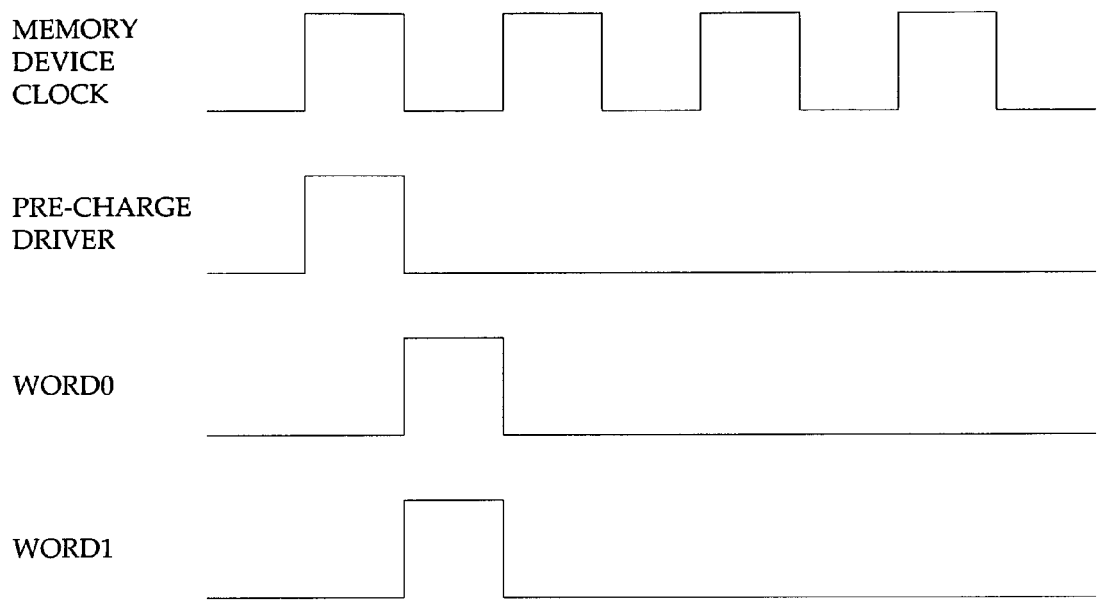
FIGS. 5A and 5B illustrate timing diagrams for various electrical signals consistent with at least one embodiment of the present invention; and, FIG. 6 illustrates an example of a process for generating an embedded memory, with weak bit testing capabilities, from designs of memory components utilizing a memory compiler consistent with one embodiment of the invention.
Figure 5B:
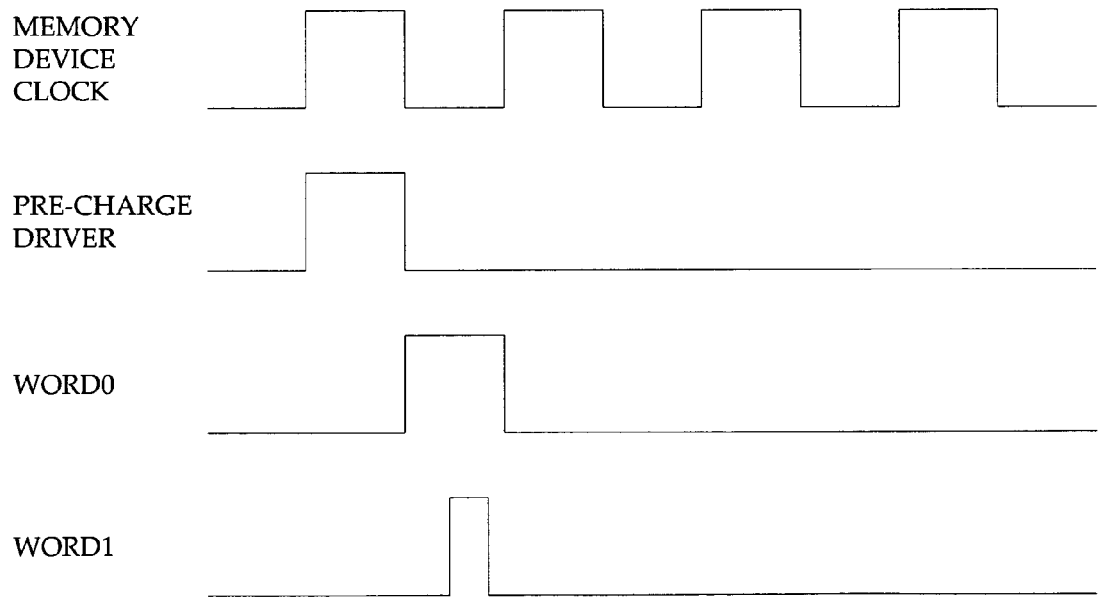

In an alternative embodiment of the invention, at operation 44, the word-line of one memory cell may be asserted prior to the word-line of the adjacent memory cell, such that one word-line is asserted for one or more clock cycles, while the word-line of the neighboring cell is asserted for only a portion of a clock cycle. This is illustrated in FIGS. 5A and 5B, which show timing diagrams for various electronic signals utilized in two different embodiments of the invention. As shown in FIG. 5B, the word-line WORD-LINE1 is asserted for only a portion of a clock cycle, while word-line WORD-LINE0 is asserted for an entire clock cycle.

Additionally, in one embodiment of the invention, the memory testing operations described above may be performed while the memory device is subjected to additional stress conditions. For example, the memory device may be subjected to a low voltage and/or high temperature condition during the memory testing operations.

Figure 6:
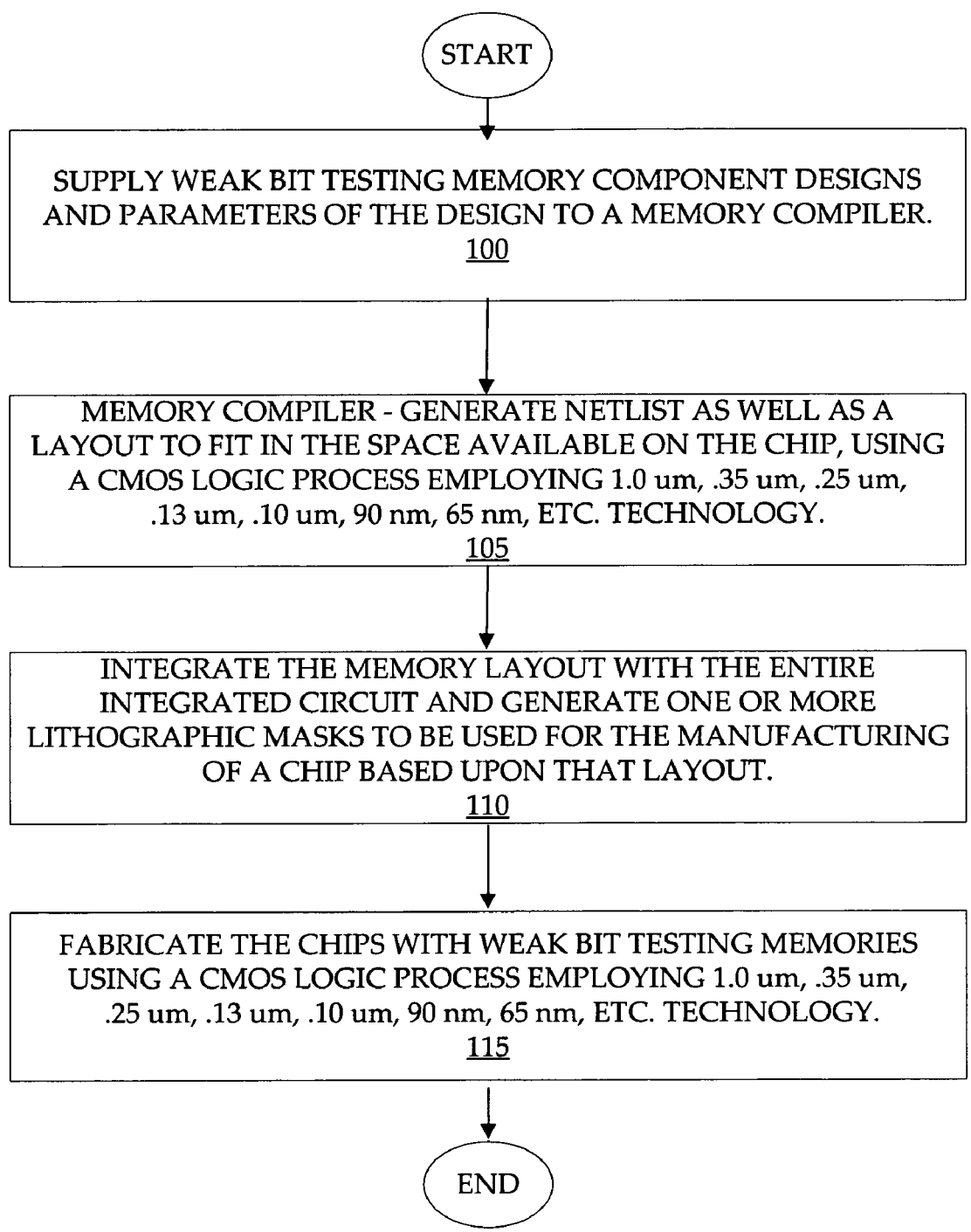

FIG. 6 illustrates an example of a process for generating a memory with weak bit testing capabilities from designs of memory components utilizing a memory compiler consistent with one embodiment of the invention. In block 100, the designs for each memory component for the weak bit testing memory are supplied to the memory compiler, as well as other design parameters such as the number of columns and number of rows of the array, the available size on the chip and other parameters. Thus, the designs for a weak bit testing memory design may be supplied to the memory compiler. A memory compiler may be a software program comprised of multiple algorithms and designs for the purpose of generating a circuit design and a layout in a space available on a target chip. The set of application-specific algorithms and interfaces of the memory compiler may be used by system integrated circuit (IC) integrators to rapidly create hundreds of silicon-proven memory cores. The memory compiler may receive the memory component designs and utilize those memory component designs in conjunction with memory circuit designs to optimize a circuit design and layout in the space available on a target chip.

In block 105, the memory compiler may generate a netlist and a layout targeted to fit in the space available on a target chip. Typically, the memory compiler will store the data representing the memory with weak bit testing capabilities on a machine-readable medium. The memory compiler may select the memory component building blocks so that they are sized appropriately for the targeted fabrication technology. The memory compiler then may provide the memory layout to be used to generate one or more lithographic masks utilized in the fabrication of the weak bit testing memory. The memory compiler may also provide a netlist for verification of the weak bit testing memory.

In block 110, the generated memory layout may be integrated with the rest of the layout for the chip and a machine may generate the lithographic masks that contain the information necessary for the fabrication of a functional device. The machine may generate one or more lithographic masks for transferring the circuit design onto the chip.

In block 115, a fabrication facility may fabricate one or more chips with the weak bit testing memories utilizing the lithographic masks generated from the memory compiler's circuit design and layout. Fabrication facilities may use a standard CMOS logic process having minimum line widths such as 1.0 um, 0.50 um, 0.35 um, 0.25 um, 0.18 um, 0.13 um, 0.10 um, 90 nm, 60 nm or less, to fabricate the chips. The size of the CMOS logic process employed typically defines the smallest minimum lithographic dimension that can be fabricated on the chip using the lithographic masks, which in turn, determines minimum component size. According to one embodiment, light may pass through these lithographic masks onto the chip to transfer the circuit design and layout for the weak bit testing memory onto the chip itself. In one embodiment, the memory design compiler is designed for embedded applications in a standard CMOS logic process.

In one embodiment, a memory compiler may be implemented in software as a set of instructions stored on a machine-readable medium. A machine-readable medium may include any mechanism that provides (e.g., stores and/or transmits) information in a form readable by a machine (e.g., a computer). For example, a machine-readable medium may include, but not be limited to: read only memory (ROM); random access memory (RAM); magnetic disk storage media; optical storage media; flash memory devices; DVD's; electrical, optical, acoustical or other forms of propagated signals (e.g., carrier waves, infrared signals, digital signals); EPROMs; EEPROMs; FLASH, magnetic or optical cards; or any other type of media suitable for storing electronic instructions. Instruction on a slower medium could be cached to a faster, more practical, medium.

In one embodiment, an example memory compiler may comprise the following: a graphic user interface, a common set of processing elements, and a library of files containing design elements such as circuits, control logic, and cell arrays that define the weak bit testing memory. In addition, one embodiment, a memory compiler may include object code in a set of executable software programs.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussions, it is appreciated that throughout the description, discussions utilizing terms such as "reading" or "writing" or "calculating" or "determining" or "displaying" or the like, refer to the action and processes of a computer system, electronic circuit, or similar electronic computing device, that manipulates and transforms data represented as physical (electronic) quantities within the computer system's registers and memories into other data similarly represented as physical quantities within the computer system memories or registers, or other such information storage, transmission or display devices.

Thus, a method and system are provided with reference to specific exemplary embodiments. It will be evident that various modifications and changes may be made to these embodiments without departing from the broader spirit and scope of the invention. For example, the SoC 20 shown in FIG. 3 is presented as an example of the type of system in which the present invention may be integrated, but is not meant in any way to limit the present invention to such an implementation. It will be appreciated that the present invention may be implemented to work with a wide variety of integrated circuit devices, including stand-alone memory devices, ASICs and SoCs that vary from those presented herein. Accordingly, the specification and drawings are to be regarded in an illustrative rather than a restrictive sense.

We claim:

1. A method for identifying data retention faults in a volatile memory cell, the method comprising:
    writing opposite data to two adjacent memory cells in a volatile memory cell array, the two adjacent memory cells connected via common bit-lines;
    generating a stress condition by pre-charging the common bit-lines, and then simultaneously asserting a word-line for each of the two adjacent memory cells for a predetermined period of time; and,
    comparing the data stored in the two adjacent memory cells after generating the stress condition with the data originally written to the two adjacent memory cells to determine whether a data retention fault has occurred.

2. The method of claim 1, wherein writing, pre-charging, asserting, and reading occur at a clock frequency substantially equivalent to a maximum operating frequency of the memory device.

3. The method of claim 1, wherein, after comparing the data, the method is repeated using complementary data so that a memory cell originally written with a logical "1" is written with a logical "0", and a memory cell originally written with a logical "0" is written with a logical "1".

4. The method of claim 1, wherein the volatile memory cell is an SRAM memory cell.

5. A method for testing the stability of a memory cell in a volatile memory cell array, the method comprising:
    writing a logical "0" to a first memory cell;
    writing a logical "1" to a second memory cell, the second memory cell adjacent to the first memory cell and connected to the first memory cell via common bit-lines;
    pre-charging the common bit-lines connecting the first and second memory cells;
    simultaneously asserting the word-line for each of the first and second memory cells for a predetermined period of time; and
    reading the logical value stored in each memory cell to ascertain whether the logical value is the logical value that was written to the memory cell prior to pre-charging the common bit-lines.

6. The method of claim 5 wherein writing, pre-charging, asserting, and reading occur at a clock frequency substantially equivalent to a maximum operating frequency of the memory device.

7. The method of claim 5, wherein the first memory cell is one of several memory cells in a first row of memory cells and the second memory cell is one of several memory cells in a second row of memory cells.

8. The method of claim 5, wherein asserting the word-line for each of the first and second memory cells for a predetermined period of time includes asserting the word-line for each of the first and second memory cells for at least one clock cycle of the memory device.

9. The method of claim 5, wherein pre-charging the common bit-lines connecting the first and second memory cells includes applying a voltage level equivalent to the voltage level of the power source of the memory device for at least one clock cycle of the memory device.

10. The method of claim 5, wherein, after reading the logical value stored in each memory cell to ascertain whether the logical value is the logical value that was written to the memory cell prior to pre-charging the common bit-lines, the method is repeated using complementary data so that the first memory cell, originally written with a logical "0", is written with a logical "1", and the second memory cell, originally written with a logical "1", is written with a logical "0".

11. The method of claim 10, wherein the method is controlled by a built-in self-test engine in the field, after the memory has been put into operation.

12. The method of claim 5, wherein the memory cell is an SRAM memory cell.

13. A machine-readable medium storing data that represents a memory device to perform the method of claim 5.

14. The machine-readable medium of claim 13 storing a memory compiler to provide a design for one or more lithographic masks used in fabricating the memory device.

15. A method for testing the stability of a memory cell in a volatile memory cell array, the method comprising:
    writing a logical "0" to a first memory cell;
    writing a logical "1" to a second memory cell, the second memory cell adjacent to the first memory cell and connected to the first memory cell via common bit-lines;
    pre-charging the common bit-lines connecting the first and second memory cells;
    asserting the word-line of the first memory cell for at least one clock cycle of the memory device;
    while the word-line of the first memory cell is being asserted, asserting the word-line of the second memory cell for a portion of one clock cycle of the memory device; and, reading the logical value stored in each memory cell to ascertain whether the logical value is the logical value that was written to the memory cell prior to pre-charging the common bit-lines.

16. The method of claim 15 wherein writing, pre-charging, asserting, and reading occur at a clock frequency substantially equivalent to a maximum operating frequency of the memory device.

17. The method of claim 15, wherein the first memory cell is one of several memory cells in a first row of memory cells and the second memory cell is one of several memory cells in a second row of memory cells.

18. The method of claim 15, wherein pre-charging the common bit-lines connecting the first and second memory cells includes applying a voltage level equivalent to the voltage level of the power source of the memory device for at least one clock cycle of the memory device.

19. The method of claim 15, wherein, after reading the logical value stored in each memory cell to ascertain whether the logical value is the logical value that was written to the memory cell prior to pre-charging the common bit-lines, the method is repeated using complementary data so that the first memory cell, originally written with a logical "0", is written with a logical "1", and the second memory cell, originally written with a logical "1", is written with a logical "0".

20. The method of claim 15, wherein the method is controlled by a built-in self-test engine in the field, after the memory has been put into operation.

21. The method of claim 15, wherein the memory cell is an SRAM memory cell.

22. A machine-readable medium storing data that represents a memory device to perform the method of claim 15.

23. The machine-readable medium of claim 22 storing a memory compiler to provide a design for one or more lithographic masks used in fabricating the memory device.

24. An apparatus comprising:
a test circuit for testing the individual memory cells of a volatile memory device for data retention faults, the test circuit to implement an algorithm that performs the following method:
write opposite data to two adjacent memory cells in a volatile memory cell array, the two adjacent memory cells connected via common bit-lines;
generate a stress condition by pre-charging the common bit-lines, and then simultaneously asserting a word-line for each of the two adjacent memory cells for a predetermined period of time; and,
comparing the data stored in the two adjacent memory cells after generating the stress condition with the data originally written to the two adjacent memory cells to determine whether a data retention fault occurred.

25. The apparatus of claim 24, wherein the test circuit operates at a clock frequency substantially equivalent to a maximum operating frequency of the memory device.

26. The apparatus of claim 24, wherein, after comparing the data, the method is repeated using complementary data so that a memory cell originally written with a logical "1" is written with a logical "0", and a memory cell originally written with a logical "0" is written with a logical "1".

27. The apparatus of claim 24, wherein the volatile memory device is an SRAM memory device.

28. An apparatus comprising:
a test circuit for testing the individual memory cells of a volatile memory device for data retention faults, the test circuit to implement an algorithm that performs the following method:
write a logical "0" to a first memory cell;
write a logical "1" to a second memory cell, the second memory cell adjacent to the first memory cell and connected to the first memory cell via common bit-lines;
pre-charge the common bit-lines connecting the first and second memory cells;
simultaneously assert the word-line for each of the first and second memory cells for a predetermined period of time;
read the logical value stored in each memory cell to ascertain whether the logical value is the logical value that was written to the memory cell prior to pre-charging the common bit-lines.

29. The apparatus of claim 28, wherein the test circuit operates at a clock frequency substantially equivalent to a maximum operating frequency of the memory device.

30. The apparatus of claim 28, wherein the memory device includes word-line test logic to simultaneously assert the word-line for each of the first and second memory cells for a predetermined period of time.

31. The apparatus of claim 28, wherein the test circuit is to repeat the method using complementary data so that the first memory cell, originally written with a logical "0", is written with a logical "1", and the second memory cell, originally written with a logical "1", is written with a logical "0".

32. The apparatus of claim 28, wherein the volatile memory device is an SRAM memory device.

33. A machine-readable medium storing data that represents the apparatus of claim 28.

34. The machine-readable medium of claim 33 storing a memory compiler to provide a design for one or more lithographic masks used in fabricating the apparatus.

35. An apparatus comprising:
a test circuit for testing the individual memory cells of a volatile memory device for data retention faults, the test circuit to implement an algorithm that performs the following method:
write a logical "0" to a first memory cell;
write a logical "1" to a second memory cell, the second memory cell adjacent to the first memory cell and connected to the first memory cell via common bit-lines;
pre-charge the common bit-lines connecting the first and second memory cells;
assert the word-line of the first memory cell for at least one clock cycle of the memory device;
while the word-line of the first memory cell is being asserted, assert the word-line of the second memory cell for a portion of one clock cycle of the memory device; and,
read the logical value stored in each memory cell to ascertain whether the logical value is the logical value that was written to the memory cell prior to pre-charging the common bit-lines.

36. The apparatus of claim 35 wherein the test circuit operates at a clock frequency substantially equivalent to a maximum frequency of the memory device.

37. The apparatus of claim 35, wherein the memory device includes word-line test logic to assert the word-line of the first memory cell for at least one clock cycle of the memory device, and to assert the word-line of the second memory cell for a portion of one clock cycle of the memory device, while the word-line of the first memory cell is being asserted.

38. The apparatus of claim 35, wherein the test circuit is to repeat the method using complementary data so that the first memory cell, originally written with a logical "0", is written with a logical "1", and the second memory cell, originally written with a logical "1", is written with a logical "0".

39. The apparatus of claim 35, wherein the volatile memory device is an SRAM memory device.

40. A machine-readable medium storing data that represents the apparatus of claim 35.

41. The machine-readable medium of claim 35 storing a memory compiler to provide a design for one or more lithographic masks used in fabricating the apparatus.

42. An apparatus comprising:
- a bus;
- processor logic;
- an array of memory cells, each memory cell connected to a pair of common bit-lines and a word-line, the array of memory cells connected to the processor logic via the bus; and
- a built-in self-test engine to identify defective memory cells in the array of memory cells by:
  - writing opposite data to two adjacent memory cells in the memory cell array, the two adjacent memory cells connected via the common bit-lines;
  - generating a stress condition by pre-charging the common bit-lines, and then simultaneously asserting the word-line for each of the two adjacent memory cells for a predetermined period of time; and,
  - comparing the data stored in the two adjacent memory cells after generating the stress condition with the data originally written to the two adjacent memory cells to determine whether a data retention fault occurred.

43. The apparatus of claim 42, wherein the memory cells are SRAM memory cells.

44. A machine-readable medium storing data that represents the apparatus of claim 42.

45. The machine-readable medium of claim 44 storing a memory compiler to provide a design for one or more lithographic masks used in fabricating the apparatus.

* * * * *